United States Patent
Kadow et al.

(10) Patent No.: US 7,492,212 B1
(45) Date of Patent: Feb. 17, 2009

(54) ADAPTIVE CAPACITANCE FOR TRANSISTOR

(75) Inventors: Christoph Kadow, Munich (DE); Paolo Del Croce, Fuernitz (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 11/842,684

(22) Filed: Aug. 21, 2007

(51) Int. Cl.
*H03K 17/687* (2006.01)
(52) U.S. Cl. .................. 327/429; 327/434; 327/376; 327/377; 257/341
(58) Field of Classification Search .......... 327/427, 327/429, 434, 376, 377

See application file for complete search history.

(56) References Cited

U.S. PATENT DOCUMENTS

| 5,164,802 | A * | 11/1992 | Jones et al. ............. 257/341 |
| 6,753,574 | B2 * | 6/2004 | Yamaguchi et al. ........ 257/341 |
| 7,408,399 | B2 * | 8/2008 | Salato et al. ............ 327/427 |

* cited by examiner

*Primary Examiner*—Long Nguyen
(74) *Attorney, Agent, or Firm*—Schwegman, Lundberg & Woessner, P.A.

(57) ABSTRACT

A circuit includes a transistor having a source, drain, a gate, and an electrode structure. A source terminal is coupled to the source. A drain terminal coupled to the drain. Terminals are coupled to the gate and to the electrode structure. A switch is coupled to the source, the gate terminal and the electrode terminal to selectively couple one of the gate and electrode structure to the source. In further embodiments, a second switch is used to selectively couple a resistor between the gate and the source. A method is used to control the switches to keep the transistor in an off state or allow it to switch to an on state.

20 Claims, 5 Drawing Sheets

US 7,492,212 B1

ADAPTIVE CAPACITANCE FOR TRANSISTOR

BACKGROUND

Trench metal oxide semiconductor (MOS) transistors have been used as power transistors for switching external loads. Trench MOS transistors are one type of power transistor that exhibits electromagnetic susceptibility (EMS). EMS quantifies the immunity of a transistor switch to noise. If the transistor has a poor EMS, it may incorrectly switch from an off state to an on state in response to noise. This can be problematic in a noisy environment.

In one prior device, the power transistor had a gate switchably coupled through a resistor to a source. The gate and source were connected by the switch when it was desired to keep the power transistor in an off state. Since the gate and source were connected, the voltage between them was minimal, and the power transistor remained off. The switch was open when it was desired to allow the power transistor to be in an on state as controlled by a difference between the gate voltage and source voltage.

DETAILED DESCRIPTION

In the following description, reference is made to the accompanying drawings that form a part hereof, and in which is shown by way of illustration specific embodiments which may be practiced. These embodiments are described in sufficient detail to enable those skilled in the art to practice the invention, and it is to be understood that other embodiments may be utilized and that structural, logical and electrical changes may be made without departing from the scope of the present invention. The following description of example embodiments is, therefore, not to be taken in a limited sense, and the scope of the present invention is defined by the appended claims.

A trench MOS transistor with dynamic switchable capacitance provides improved electromagnetic susceptibility (EMS) for high frequency noise. In various embodiments, additional contacts to existing structures may be provided to obtain the switchable capacitance between a gate and source of the transistor. Several alternative geometries of power transistors are described, and an additional switch for providing a switchable resistance between the gate and source is provided such that both high and low frequency noise EMS may be improved.

Figure 1:
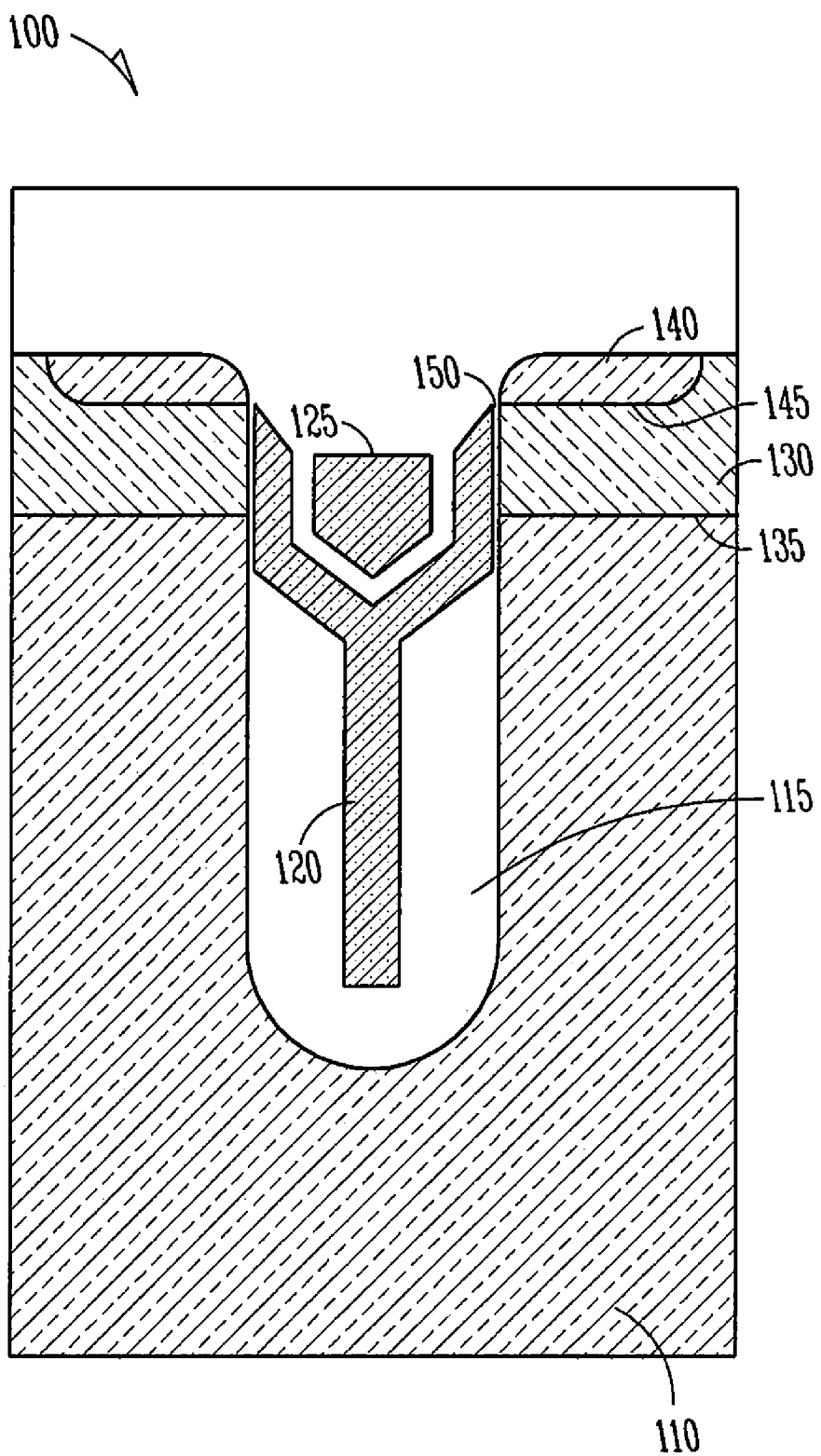
FIG. 1 is a schematic cross section of a transistor according to an example embodiment.

FIG. 1 is a schematic cross section of an example trench MOS transistor indicated generally at 100. In one embodiment, trench transistor 100 is a metal oxide semiconductor (MOS) power transistor which may be formed in a conventional manner supported by a substrate. Additional circuitry may be formed on the same substrate. A drain 110 may be supported by the substrate or formed in the substrate as illustrated. An insulator filled trench 115 is formed, extending down into the drain 110. Within the insulator filled trench 115, a gate layer or structure 120 is formed, extending into the trench 115. An additional electrode structure 125 is formed about a top of the gate and is separated from the gate structure by an insulated spacer.

The electrode structure 125 in one embodiment is integral with the gate structure. In one embodiment, the electrode structure 125 is formed within a chip area corresponding to the gate layer 125 and is proximate thereto. The electrode structure 125 originally is an affect left from an MOS process utilized in the manufacture of transistor 100 and facilitated planarization of the surface of transistor 100. A bulk region 130 is formed above the drain and is insulated from the drain by an insulating region 135. A source 140 is formed above the bulk region 130 and is also insulated from the bulk region 130 at 145. A channel 150 is formed between a top portion of the gate 120 and the bulk region 130 and source 140. The drain 110 may be further divided into a higher doped n type drain region that extends below the trench 115 along with a lower doped n-type drift region above the drain region. In one embodiment, the drain region may extend up as high as portions of the trench 115.

In one embodiment, the gate structure 120 and electrode structure 125 comprise multiple levels, and may be formed of polysilicon. The levels form an integrated structure for the transistor 100. Insulation spacers and areas may be formed of oxides in various embodiments. Similar semiconductor materials may be used in place of polysilicon, and other insulative materials may be used for the oxide.

Contacts are normally formed to the drain 110, gate structure 120 and source 140. A resistor may be selectively coupled by a switch between the gate and source contacts in one embodiment. This provides the ability to keep the transistor 100 in an off state when it is used to couple the gate and source. The resistance has usually been in the 1 kΩ to 2 kΩ range. The value of the resistor may be determined from ESD self protection requirements. For low frequency disturbances, the transistor 100 has a very high impedance at each terminal, and the resistor works as a good short circuit between the gate and source terminals.

For high frequency disturbances, the transistor 100 may have much lower impedance at the terminals, so the resistor cannot be a good short circuit. Dynamically, $V_{GS} \neq 0$ is allowed and this can drive the transistor into the on state, reducing EMS. In such high frequency ranges, the internal transistor 100 capacitances from gate to source and from gate to drain, play a significant role in defining the EMS. These capacitances drive the gate voltage working one against the other, as in a capacitive voltage divider. A gate to source capacitance, $C_{GS}$ and gate to drain capacitance, $C_{GD}$ are normally determined by the internal capacitances of a transistor.

Increasing $C_{GS}$ at constant $C_{GD}$ (increasing the $C_{GS}/C_{GD}$ ratio) will result in a better EMS. To increase $C_{GS}$, additional on-chip capacitors with capacitances of the same order magnitude as the transistor's internal capacitances, if added, would consume additional chip area, increasing costs. Adding such additional capacitances external to the chip would result in an increase in the number of components, also increasing costs. Both of these alternatives are undesirable.

Figure 2:
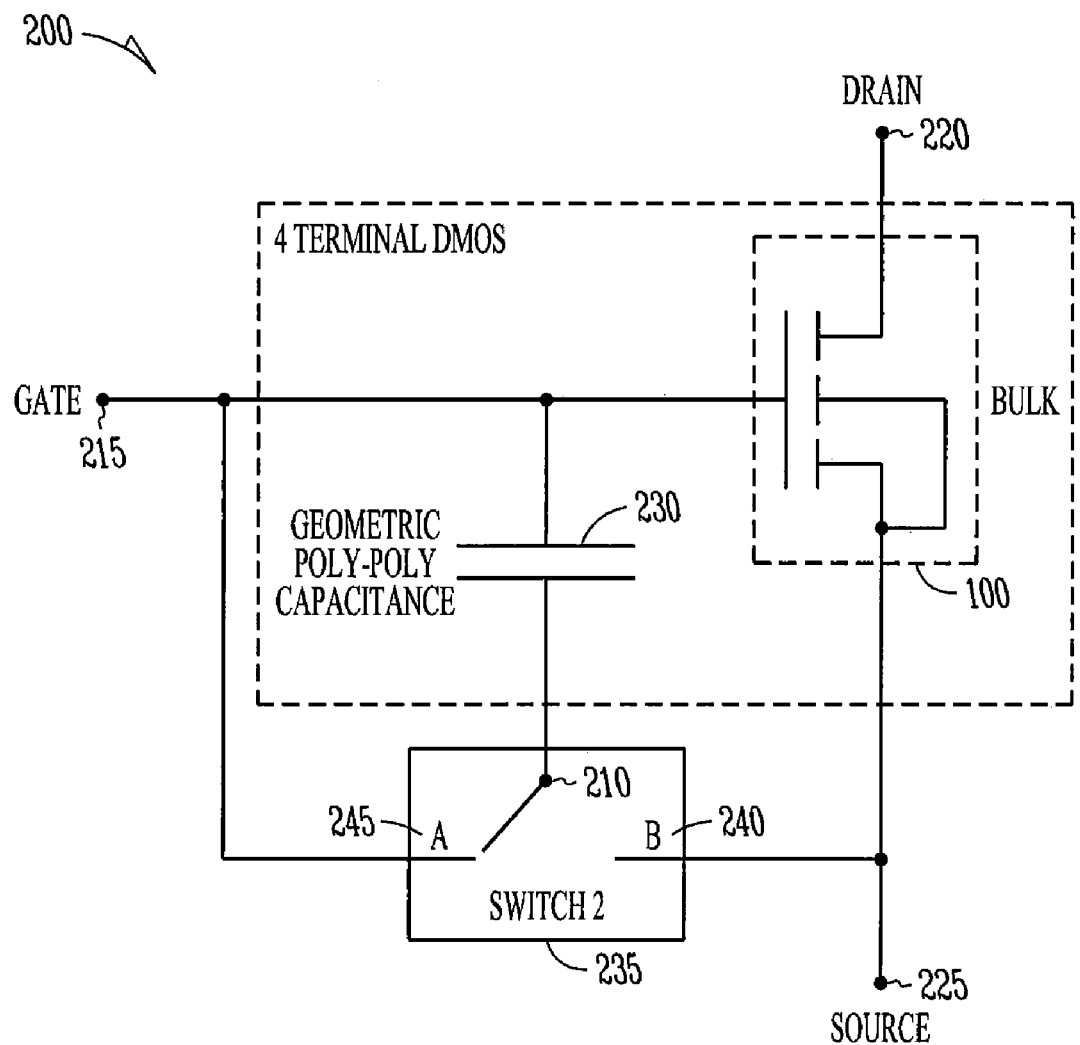
FIG. 2 is a circuit diagram of a transistor with an adaptive capacitance according to an example embodiment.

In one embodiment shown at 200 in FIG. 2, an additional electrode terminal 210 is formed to the electrode structure 125. In the circuit diagram of FIG. 2, the transistor is indicated by broken line 100 electrically consistent with FIG. 1, but does not reflect the integral nature of the electrode structure 125. A gate terminal 215, drain terminal 220 and source terminal 225 are also illustrated, providing a four terminal MOS power switch in one embodiment. The capacitance, $C_{GE}$, between the gate structure 120 and electrode structure 125 is illustrated at 230. In one embodiment, $C_{GE}$ is of the same order magnitude as the internal capacitance between the gate polysilicon and silicon regions of the transistor.

A switching circuit 235, which may be formed as additional circuitry on the same substrate is coupled between gate terminal 215, electrode terminal 210 and source terminal 225. The switch 235 may be used to selectively couple $C_{GE}$ 230 between the gate and source when it is desired to have the transistor off. The additional capacitance helps keep the gate to source voltage low, keeping the transistor in an off state for higher frequency noise.

When the switch 235 is in position B 240, it provides such coupling. In position A 245, $C_{GE}$ 230 is shorted to the gate terminal 215 and is no more effective. This allows the transistor 100 to be switched in an on state without extra gate charge. By dynamically switching the connections between the transistor terminals and the polysilicon regions, the contribution of the capacitance $C_{GE}$ 230 to the transistor 100 capacitances may be dynamically adapted to the state of the transistor 100. Because $C_{GE}$ 230 is typically on the same order as the internal transistor capacitances, significant changes to $C_{GS}$ are possible. Increasing $C_{GS}$ at constant $C_{GD}$ by switching $C_{GE}$ 230 in parallel with the transistor's internal capacitance increases the effective $C_{GS}/C_{GD}$ ratio, resulting in a better EMS for higher frequency noise.

In one embodiment, $C_{GE}$ 230 is provided by an integrated multi-level or multi-layer structure without the need for additional components, or added real estate on a chip in which the transistor 100 is formed.

Figure 3:
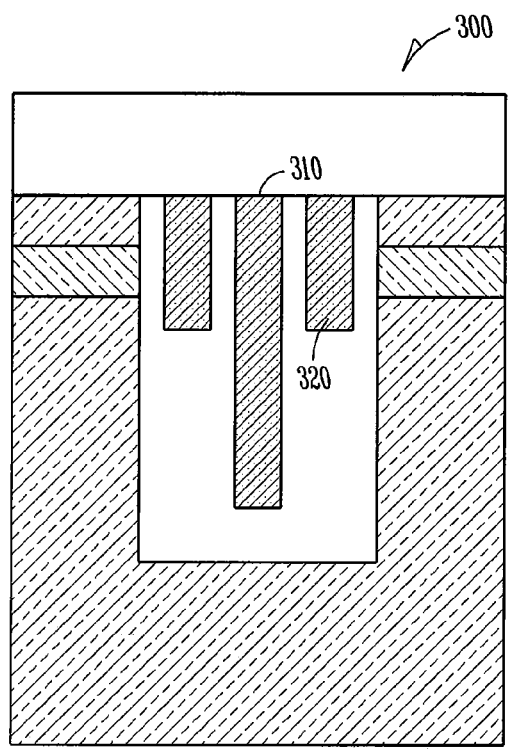
FIG. 3 is a block diagram of an alternative geometry for a MOS transistor according to an example embodiment.

FIG. 3 is a block diagram of an alternative geometry 300 for a trench MOS transistor according to an example embodiment. In addition to gate, source, and drain terminals, a fourth terminal is provided to polysilicon area 310 to take advantage of the capacitance between a gate 320 and the polysilicon area 310 by connecting the terminals in accordance with the circuit 200. In one embodiment, such added capacitance is provided without the need for additional chip area that would be consumed by adding a separate capacitor. Polysilicon area 310 in prior devices may have been hard wired to source to reduce gate to drain capacitance. Providing the fourth terminal to polysilicon area 310 provides a circuit designer direct access. This is another example of an integrated multi-level or multi-layer structure. The levels or layer need not be vertical or horizontal layers, but simply result as part of an existing gate structure. No additional chip real estate or additional components need be included to obtain the additional capacitance.

Figure 4:
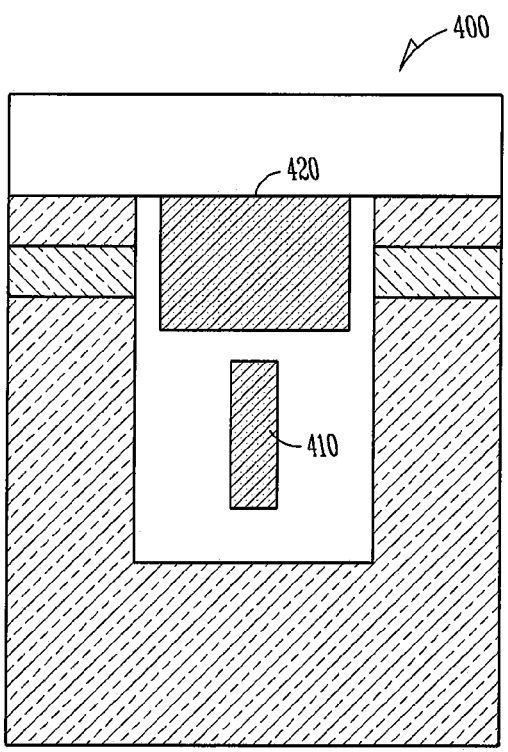
FIG. 4 is a block diagram of a further alternative geometry for a MOS transistor according to an example embodiment.

FIG. 4 is a block diagram of a further alternative geometry 400 for a trench MOS power transistor according to an example embodiment. In addition to gate, source, and drain terminals, a fourth terminal is provided to polysilicon area 410 to take advantage of the capacitance between a gate 420 and the polysilicon area 410 by connecting the terminals in accordance with the circuit 200. In one embodiment, such added capacitance is provided without the need for additional chip area that would be consumed by adding a separate capacitor. Polysilicon area 410 in prior devices may have been hard wired to source to reduce gate to drain capacitance. Providing the fourth terminal to polysilicon area 410 provides a circuit designer direct access.

Figure 5:
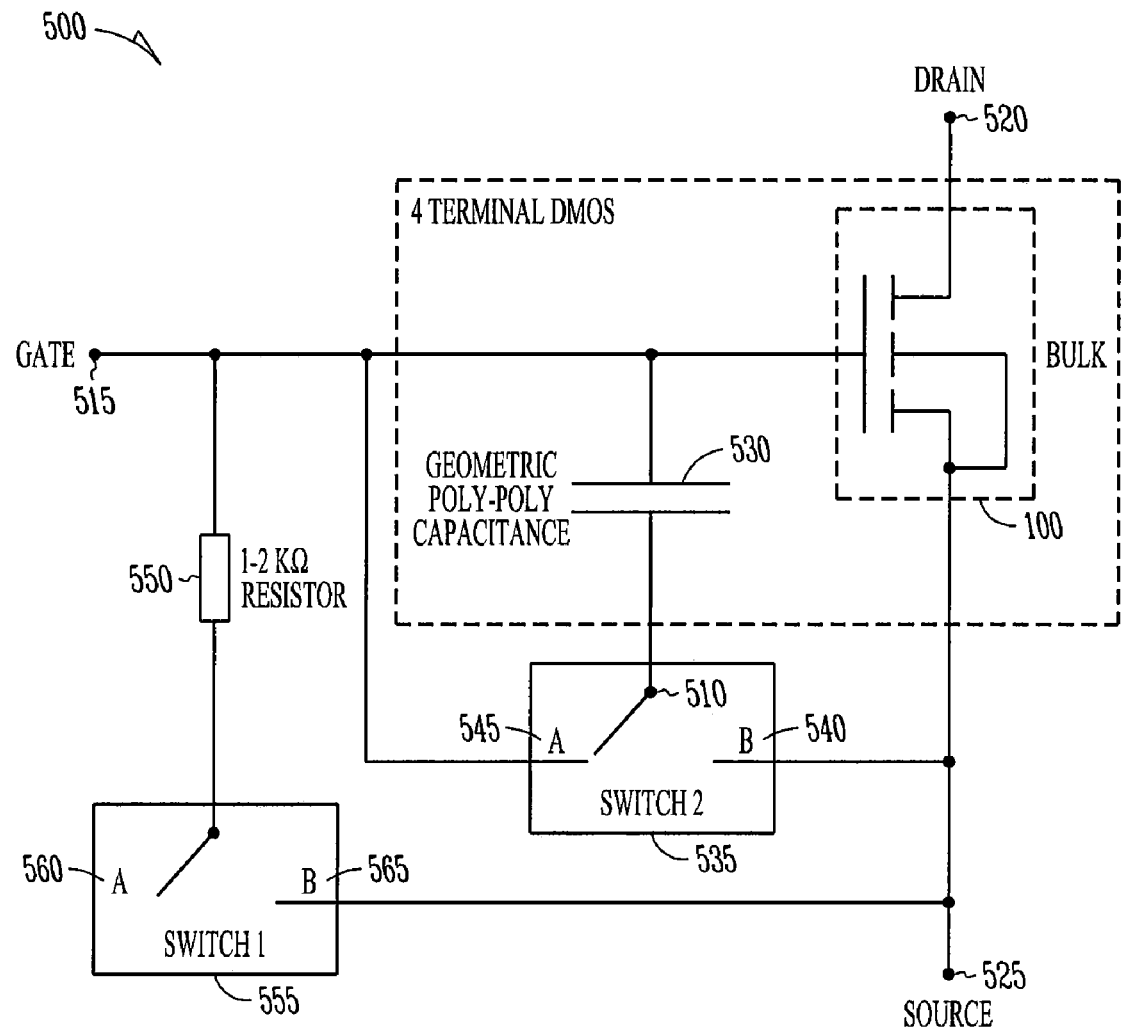
FIG. 5 is a circuit diagram of a transistor with an adaptive capacitance and resistance according to an example embodiment.

FIG. 5 is a circuit diagram 500 of a trench transistor with an adaptive capacitance and resistance according to an example embodiment. As with FIG. 3, it is electrically consistent with transistor 100 in FIG. 1, but does not reflect the integral nature of the polysilicon area used to provide additional capacitance. An additional electrode terminal 510 is formed to the electrode structure 125, which normally is left floating. In the circuit diagram, the transistor is indicated by broken line 100 consistent with FIG. 1. A gate terminal 515, drain terminal 520 and source terminal 525 are also illustrated, providing a four terminal MOS power switch in one embodiment. Geometric capacitance, $C_{GE}$, between the gate structure 120 and electrode structure 125 is illustrated at 530. It is of the same order magnitude as the internal capacitances of the transistor 100.

A switching circuit 535 is coupled between gate terminal 515, electrode terminal 510 and source terminal 525. The switch 535 may be used to selectively couple $C_{GE}$ 530 between the gate and source when it is desired to have the transistor off. When the switch 535 is in position B 540, it provides such coupling. In position A 545, $C_{GE}$ 530 is shorted to the gate terminal 515 and is no more effective. This allows the transistor 100 to be switched in an on state without extra gate charge. By dynamically switching the connections between the transistor terminals and the polysilicon regions, the contribution of these geometric capacitances to the transistor 100 capacitances may be dynamically adapted to the state of the transistor 100. Because the geometric capacitances are typically on the same order as the transistor capacitances, significant changes to the transistor capacitances are possible. Increasing $C_{GS}$ at constant $C_{GD}$ by switching $C_{GE}$ 230 in parallel with the transistor's 100 internal capacitance increases the effective $C_{GS}/C_{GD}$ ratio, resulting in a better EMS.

In one embodiment, a resistor 550 is selectively coupled between gate terminal 515 and source terminal 525 by a switch 555. In a position A at 560, the connection is open, and at a switch position B at 565, the resistor 550 is electrically coupled between gate 515 and source 525 to help keep the transistor 100 in an off state. In one embodiment, the transistor 550 has values in the 1-2 kΩ range. The resistor works to keep the voltage difference between the gate and source terminals minimal at low frequencies, while the capacitance $C_{GE}$ 530 operates to keep the voltage difference minimal at higher frequencies. In combination, EMS is improved over a broader frequency spectrum.

In one embodiment, switches 235, 535 and 555 are examples of circuits formed external to transistor 100, as opposed to the additional capacitances that are effectively integrated into the structure of transistor 100. Further additional circuitry may also be formed on the substrate.

Figure 6:
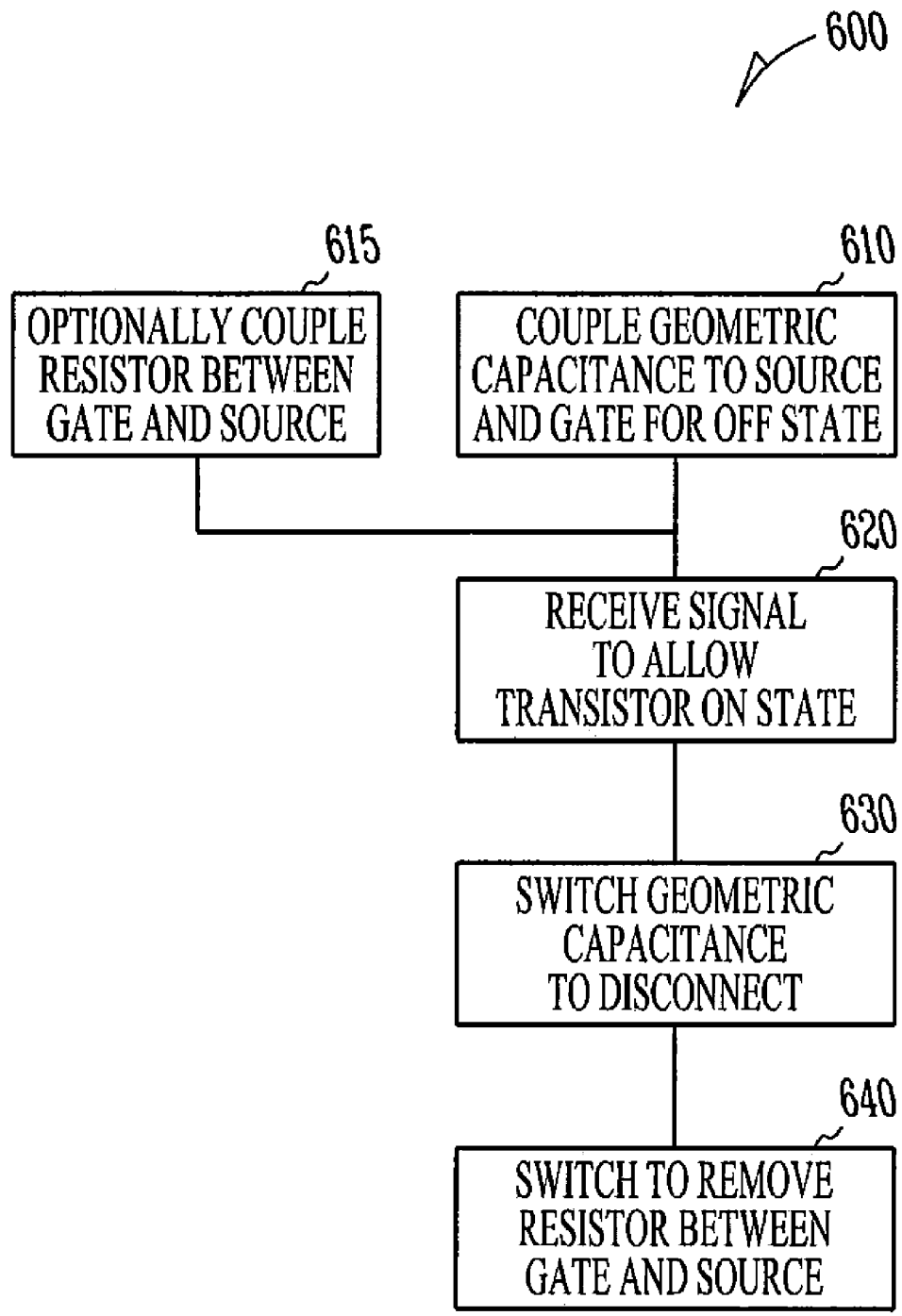
FIG. 6 is a flowchart illustrating use of switches to selectively control coupling of a capacitor and resistor to a transistor according to an example embodiment.

FIG. 6 is a flowchart illustrating a method 600 of controlling EMS protection for a transistor. At 610, a geometric capacitance formed integral with a trench MOS transistor gate is coupled to a source of the trench MOS transistor by use of a first switch to help keep the transistor in an off state. At 615, a resistor may optionally be coupled between the gate and the source of the transistor. A switch control signal may be received to control the switch to allow the transistor to transition to an on state at 620. At 630, the first switch is controlled to remove the coupling of the geometric capacitance to allow the transistor to transition to the on state. In one embodiment, the first switch has a first position to couple the geometric capacitance to the source and a second position that couples the geometric capacitance to the gate of the transistor. In still further embodiments, the gate of the transistor may be coupled via the resistor to the source by use of a second switch. The second switch has a first position to couple the gate of the transistor via the resistor to the source, and a second position to an open circuit, removing the resistor between the gate and source as indicated at 640. Both switches may be controlled to switch to their first positions to minimize EMS effects of a broad frequency spectrum of noise. In still further embodiments, the switches may be independently actuated. This allows the capacitor to be used when higher frequency noise is expected, while the resistor is effective for lower frequency noise or biases.

The Abstract is provided to comply with 37 C.F.R. §1.72(b) to allow the reader to quickly ascertain the nature and gist of the technical disclosure. The Abstract is submitted with the understanding that it will not be used to interpret or limit the scope or meaning of the claims.

The invention claimed is:

1. A circuit comprising:
 a transistor having a source, drain, gate and electrode structure;
 a source terminal coupled to the source;
 a drain terminal coupled to the drain;
 a gate terminal coupled to the gate;
 an electrode terminal coupled to the electrode structure; and
 a switch coupled to the source, the gate, and the electrode terminal to selectively couple the electrode structure to the source or the gate.

2. The circuit of claim 1 wherein the gate is an active gate layer for turning the transistor on and off, and wherein the electrode structure is insulated from the gate layer and is coupled to the switch.

3. The circuit of claim 2 wherein the transistor is a MOS trench power transistor.

4. The circuit of claim 3 wherein the electrode structure is configurable to provide additional capacitance between the gate and source.

5. The circuit of claim 4 wherein the gate layer extends into a trench in the drain.

6. The circuit of claim 2 wherein the electrode structure is formed within a chip area corresponding to the gate layer.

7. The circuit of claim 2 wherein the switch is adapted to couple the electrode structure to the source or to the gate layer in response to a switch control signal to provide additional capacitance between the gate and source.

8. The circuit of claim 2 wherein the switch is adapted to couple the electrode structure to the source or to open in response to a switch control signal.

9. The circuit of claim 1 wherein the transistor is supported by a substrate and further comprising additional circuitry supported by the substrate.

10. A circuit comprising:
 a transistor having a source, drain, gate and electrode structure;
 a source terminal coupled to the source;
 a drain terminal coupled to the drain;
 a gate terminal coupled to the gate;
 an electrode terminal coupled to the electrode structure;
 a first switch coupled to the source terminal, the gate terminal and the electrode terminal to selectively couple one of the gate and electrode structure to the source; and
 a second switch coupled to the source terminal and the gate terminal to selectively couple a resistor between the gate and the source.

11. The circuit of claim 8 wherein the gate is an active gate layer for turning the transistor on and off and is coupled to the second switch, and wherein the electrode structure is insulated from the first gate layer and is coupled to the first switch.

12. The circuit of claim 11 wherein the first switch is adapted to couple the electrode structure to the source or to the gate layer in response to a switch control signal.

13. The circuit of claim 12 wherein the second switch is adapted to couple the resistor to the source or to open.

14. The circuit of claim 12 wherein the first switch couples the electrode structure to the source and the second switch couples the resistor between the gate layer and the source to keep the transistor in an off state.

15. The circuit of claim 11 wherein the first switch is adapted to couple the second gate layer to the source or to open in response to a switch control signal.

16. A method comprising:
 coupling a geometric capacitance formed from multiple integrated layers proximate a trench MOS transistor gate to a source of the trench MOS transistor by use of a first switch to help keep the transistor in an off state; and
 opening the first switch to remove the coupling of the geometric capacitance to allow the transistor to transition to an on state.

17. The method of claim 16 wherein the first switch has a first position to couple the geometric capacitance to the source and a second position that couples the geometric capacitance to the gate of the transistor or to an open circuit.

18. The method of claim 16 and further comprising selectively coupling an gate of the transistor via a resistor to the source by use of a second switch.

19. The method of claim 18 wherein the second switch has a first position to couple the gate of the transistor via the resistor to the source, and a second position to an open circuit.

20. The method of claim 19 and further comprising controlling both switches to their first positions to minimize EMS effects of a broad frequency spectrum of noise.

* * * * *